United States Patent [19]
Dombrowski et al.

[11] Patent Number: 5,424,490
[45] Date of Patent: Jun. 13, 1995

[54] TWISTED LEAD PAIRS ON PCB TO IMPROVE COMMON MODE REJECTION

[75] Inventors: Joseph J. Dombrowski, Jr., Hollywood; Donald E. Davis, Margate; Alberto M. Gonzalez, Coral Springs; Kevin T. Lobb, Ft. Lauderdale, all of Fla.

[73] Assignee: Sony Electronics Inc., Park Ridge, N.J.

[21] Appl. No.: 202,122

[22] Filed: Feb. 25, 1994

[51] Int. Cl.⁶ .............................................. H05K 1/02
[52] U.S. Cl. ...................... 174/33; 174/261; 174/262; 174/250
[58] Field of Search ................... 170/33, 34, 261, 262, 170/250

[56] References Cited
U.S. PATENT DOCUMENTS 3,757,028  9/1993  Schlessel ................ 174/33
5,036,160  7/1991  Jackson .................. 174/33
5,039,824  8/1991  Takashima et al. ........ 174/33

Primary Examiner—Gerald P. Tolin
Assistant Examiner—L. Thomas
Attorney, Agent, or Firm—Ronald P. Kananen

[57] ABSTRACT

The invention in its main aspect comprises a printed circuit board having a bus extending along a predetermined length of a portion of said printed circuit board, the bus having a predetermined width and defining a plurality of openings therein following a predetermined regular pattern, the pattern having at least a first pair of openings positioned on a first lateral side of an imaginary line along the bus, and at least a second pair of openings positioned on a second lateral side of the imaginary line along the bus, the first and the second pairs of openings being relatively arranged so that a first lead interconnecting the first pair of openings is in a twisted pair relationship with a second lead interconnecting the second pair of openings.

2 Claims, 4 Drawing Sheets

TWISTED LEAD PAIRS ON PCB TO IMPROVE COMMON MODE REJECTION

BACKGROUND OF THE INVENTION

This invention relates generally to an improved printed circuit board (PCB). More particularly, this invention relates to an improved PCB having "twisted lends" on the PCB to improve common mode rejection. Still more particularly, this invention relates to an improved PCB having complementary leads located respectively on the solder side and component side of the PCB to improve common mode rejection.

The use of printed circuit boards to develop complex circuits having a plurality of components is well known. Such boards are usually substantially planar with a component side and a solder side, to facilitate positioning components relative to the boards and to permit soldering of those components into the circuit to be automated. A bus problem exists with such PCBs, however, in that when a bus structure exists on a PCB for an appreciable distance, the circuit on the PCB is susceptible to cross talk and induced noise from outside interference. Highly accurate circuits are adversely affected by such spurious signals.

One solution that is conventional to inhibit such cross talk and induced noise is to provide the PCB with special shielding. However, such additional structure is costly both from a materials and a labor point of view, and adds to the weight of the circuit. While technically such shielding is satisfactory, its drawbacks generally outweigh its benefits.

Another possible solution is to design into the circuit a common mode rejection circuit which assists in removing such common mode signals and in removing induced noises electronically. However, such additional circuitry is particularly expensive and does not function completely satisfactorily.

Accordingly, it remains an objective in the PCB art to develop a way to encourage a common mode rejection by circuits on the PCB, while inhibiting inducing noise, without the use of complex and expensive additional components of the PCB.

It is known in the electronics art to twist pairs of leads to improve common mode rejection of signals on the respective pair of leads. Such twisting literally occurs physically in that the pair of leads is in fact twisted into an interlaced pattern. It is thus another overall aim of this invention to determine whether such known structure is applicable to PCBs.

These and other aims and objectives of this invention will become apparent to those of skill in this art when considered in light of the written description of the invention which follows taken with the accompanying drawings.

BRIEF SUMMARY OF THE INVENTION

Directed to achieving the foregoing objectives and overcoming problems associated with an elongated bus structure on a PCB, an improved circuit board according to the invention comprises a solder side and a component side, each of which includes an elongated bus structure substantially in register. The bus structure includes a plurality of solder points. Leads are provided between respective pairs of such solder points wherein a high lead is located between a first pair of such solder points on the solder side, and a low lead is located between said first pair of such solder points on the component side and oppositely directed relative to the high lead.

A plurality of patterns for such leads are disclosed.

In providing a common mode rejection circuit on a printed circuit board, the invention in its main aspect comprises a printed circuit board having a bus extending along a predetermined length of a portion of said printed circuit board, the bus having a predetermined width and defining a plurality of openings therein following a predetermined regular pattern, the pattern having at least a first pair of openings positioned on a first lateral side of an imaginary line along the bus, and at least a second pair of openings positioned on a second lateral side of the imaginary line along the boss, the first and the second pairs of openings being relatively arranged so that a first lead interconnecting the first pair of openings is in a twisted pair relationship with a second lead interconnecting the second pair of openings.

The printed circuit board is further characterized in that the first and the second leads are preferably located on opposed sides of the printed circuit board. The printed circuit board has the first lead located on a solder side of the printed circuit board and the second lead is located on a component side of the printed circuit board.

In another aspect, the printed circuit board according to the invention is in combination with the first and the second leads which respectively are soldered at the openings.

The printed circuit board according to another aspect of the invention further includes a plurality of third leads and a plurality of fourth leads respectively in circuit with the first lead and the second lead whereby a plurality of twisted pairs of said first and said third leads are formed relative to said second and said fourth leads.

DETAILED DESCRIPTION OF THE PREFERRED EMBODIMENTS

Figure 1:
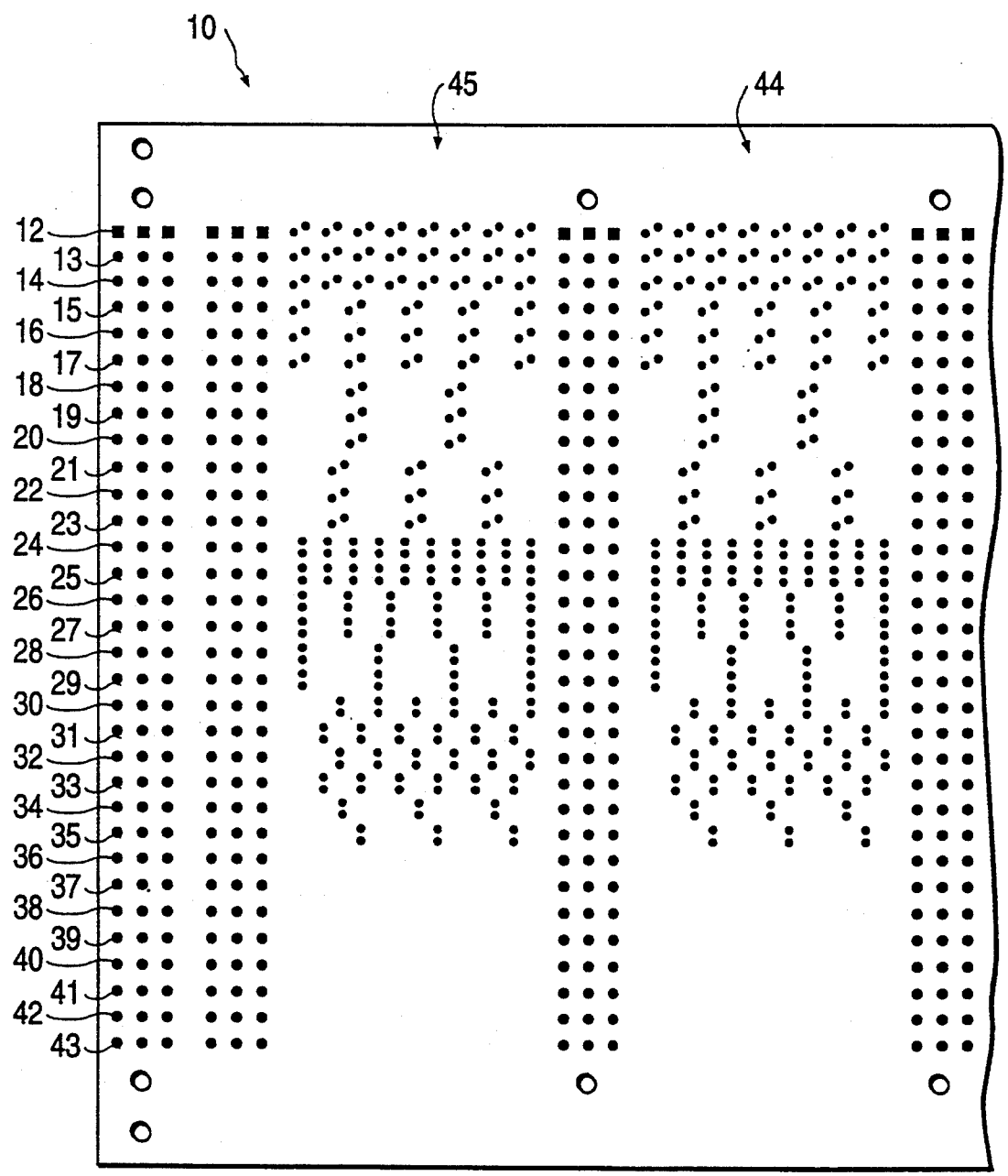
FIG. 1 is a representative showing of a portion of a PCB on which the twisted lead invention is placed.

FIG. 1 shows an end portion of a printed circuit board (PCB) 10 arranged to serve as a test board for representative patterns of twisted lead pairs according to the invention. Those representative patterns are arranged in consecutive rows of through holes (shown from left to right) in a representative plurality of columns, only two of which are shown. More specifically, the PCB 10 includes rows 12 to 43, which for test purposes are substantially alike when positioned adjacent one another in the columns 44, 45. Because of the like nature of adjacent columns, only two are shown.

Figure 2:
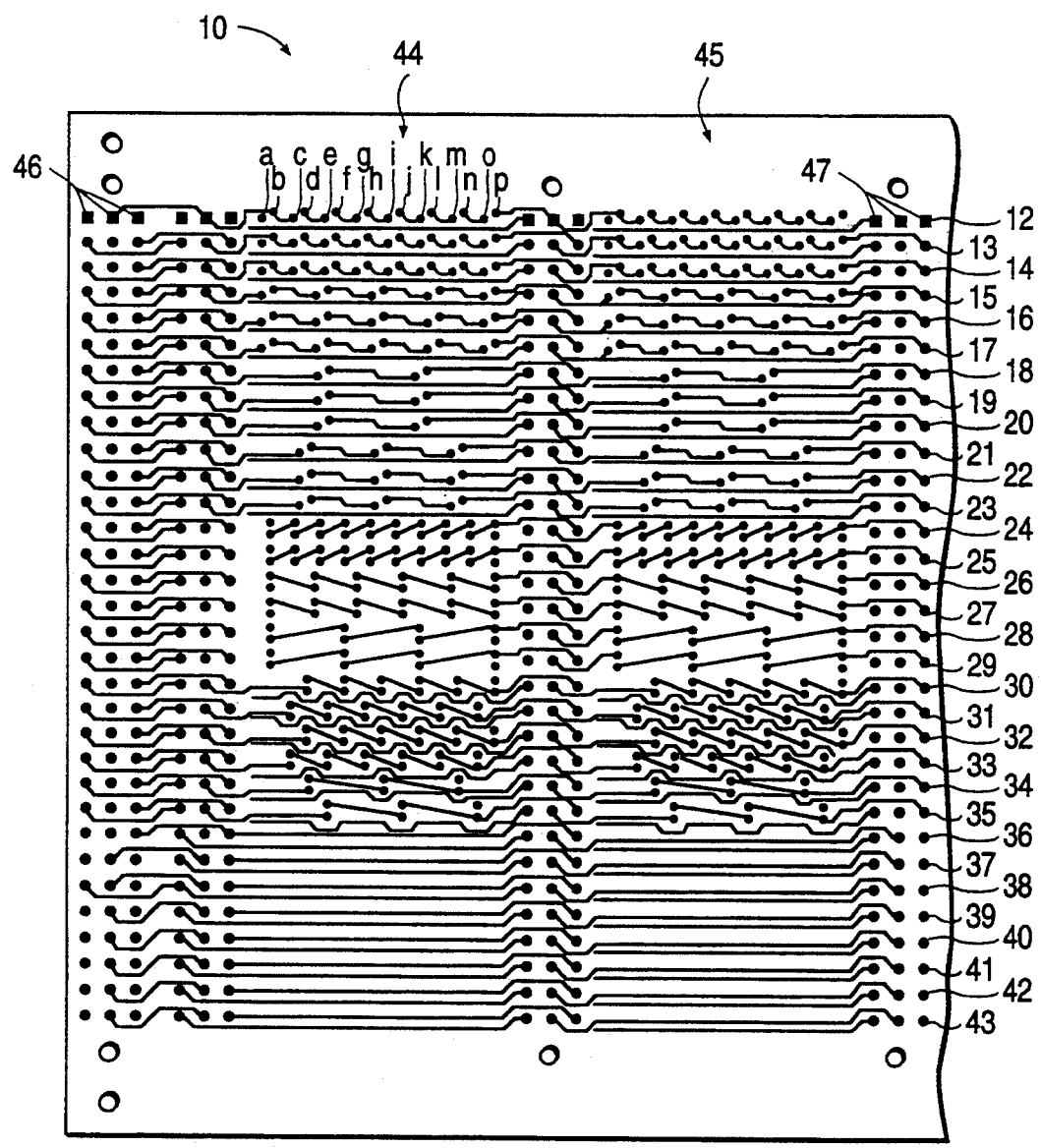
FIG. 2 is a portion of the PCB shown in FIG. 1 showing a plurality of twisted leads on a test PCB as seen from the solder side of the board.
Figure 3:
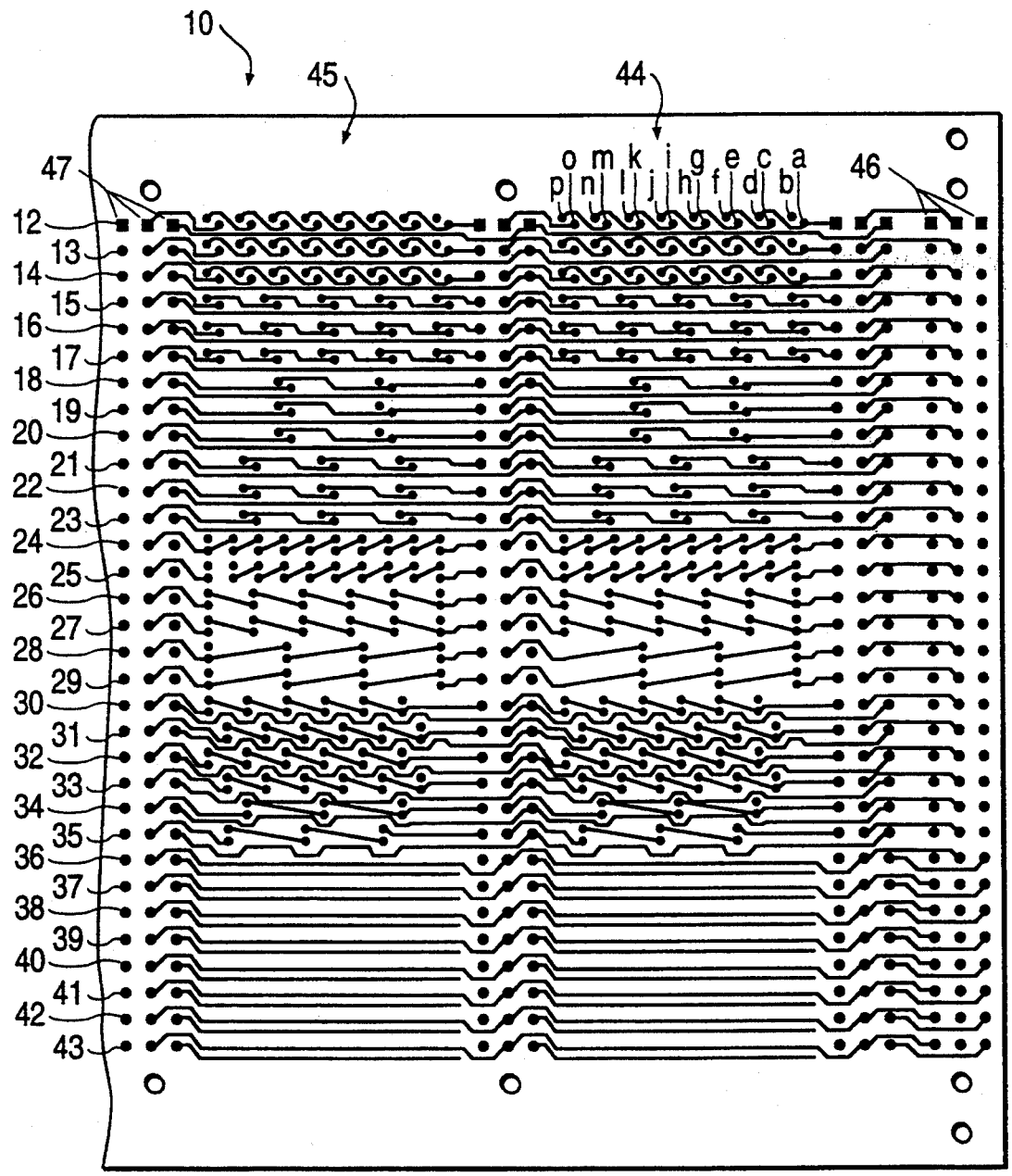
FIG. 3 is a view of the same portion of the PCB as seen in FIG. 2 but as seen from the component side of the board, showing the plurality of twisted leads.

FIG. 2 shows the end portion of the PCB 10 of FIG. 1 with leads as connected on the solder side of the board. Specifically, rows 12 to 14 are substantially identical from a first twisted pair pattern for a plurality of through holes in the board between the inlet connectors 46 (three in number) at the left side of the columns 44 and 45 and the outlet connections 47 at the right side of the columns 44 and 45. Representatively sixteen of the through holes are shown, designated generally as "pins" a to p. On the solder side therefore, a lead is connected to pin b, between pins b and c, between pins d and e, between pins f and g, and so forth. The twisted pairs to those connections is shown in FIG. 3 where the leads are connected between pins a and d, c and f, and so forth. The composition pattern can be seen in FIG. 4.

Figure 4:
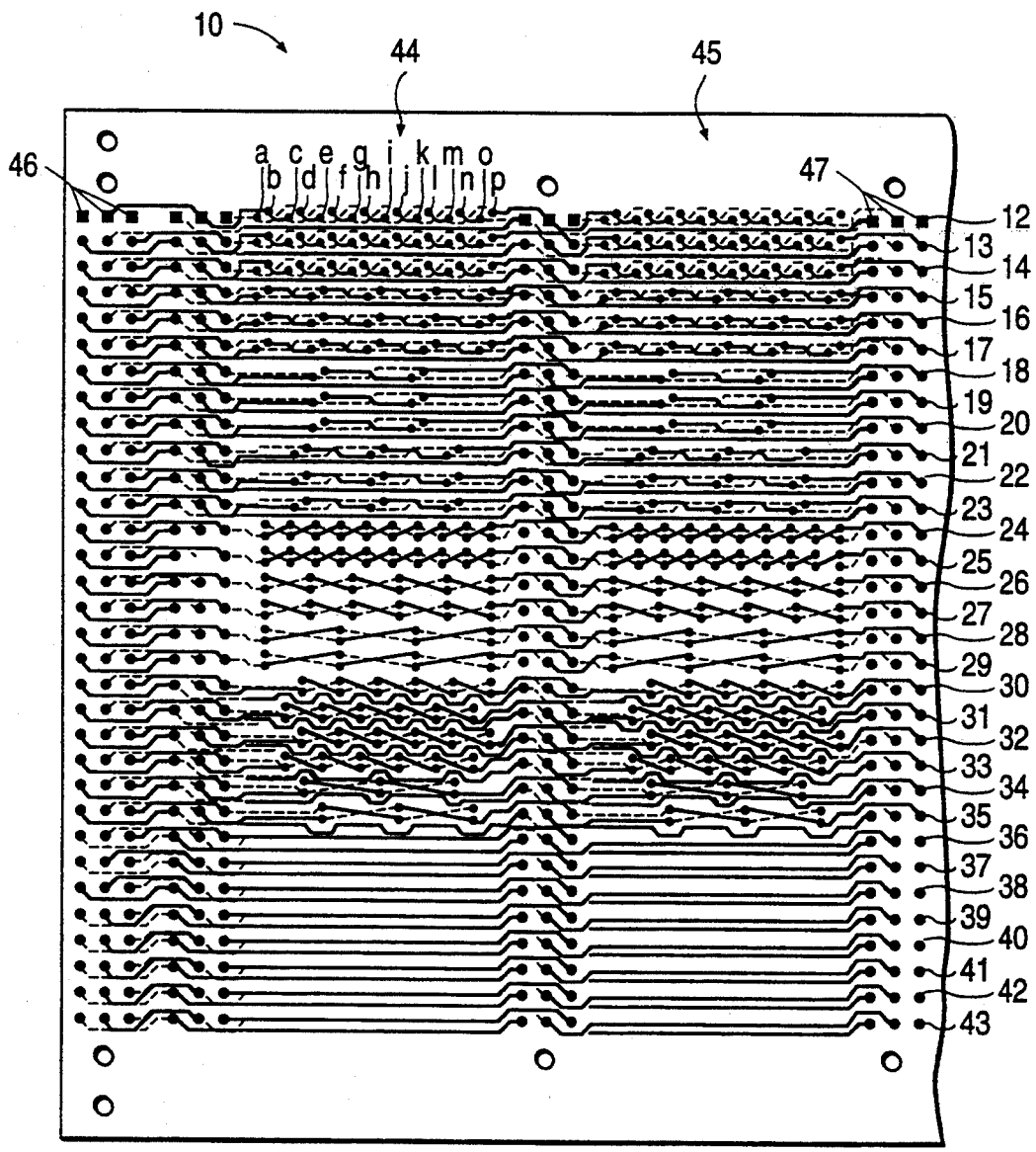
FIG. 4 is a composite view of FIGS. 3 and 4.

A second twisted pair pattern is shown in rows 15, 16, and 17, having ten pins a to j, wherein a lead on the solder side as seen in FIG. 2 is connected to pin a, and respectively between pins b and c, d and e, f and g, h and i, exiting from the column at pin j. As seen in FIG. 3, showing the component side, a opposing lead pair is connected to pin b, between pins a and d, between pins c and f, between pins e and g, between pins g and i, and out from the column at pin h. As seen in FIG. 4 in which the leads of FIG. 3 are whown as dashed lines, the opposed leads cross over each other to form the twisted pair between pins b and c, d and e, f and g, and h and i.

A third twisted pair pattern is shown in rows 18, 19, and 20 as seen for the solder side in FIG. 2, for the component side for FIG. 3, and for the twisted pair in FIG. 4.

A fourth twisted pair pattern is shown in rows 21, 22, and 23, while a fifth twisted pair pattern is shown in rows 24 and 25. A sixth twisted pair pattern is shown in rows 26 and 27, a seventh twisted pair pattern is shown in rows 28 and 29, an eighth twisted pair pattern is shown in rows 30, a ninth twisted pair pattern is shown in rows 31, 32, and 33, and a tenth twisted pair pattern is shown in rows 34 and 35. For each pair, the pattern shown for the respective rows on the solder side is shown in FIG. 2, the pattern shown for the component side is shown in FIG. 3, and the twisted pair pattern is representatively shown in FIG. 4.

Thus, according to the invention, an elongated bus structure representatively shown as a row on the PCB 10 extends for a predetermined distance across a portion of the PCB 10. As seen in FIGS. 1 to 3, through holes traversing the thickness of the PCB 10 are arranged on either side of an imaginary line traversing the elongated bus. Leads connected between respective pairs of through holes are arranged on opposite sides of the PCB 10 to form a twisted pair of leads, thus to form "twisted lands" on the PCB in order to improve common mode rejection performance of audio signals on the PCB.

By "twisting" the balanced bus layout on the PCB 10, the command mode rejection of the summing devices connected to the board may be utilized to its fullest. The arrangement is similar to using twisted pair cables for microphone inputs or for long audio feeds. By the arrangement, any induced noise from above or below the PCB is evenly distributed to the bus lands. This in turn provides matched inputs to the summing amplifier.

At present, it appears that the "twist" required for the best common mode rejection on a PC board currently is a PC board having a uniform crossing pattern for the respective twisted pairs which are slightly staggered relative to the next bus set of twisted patterns.

These and other features of this invention will be apparent to those skilled in the art and the scope of the invention is determined by the claims.

What is claimed is:

1. A printed circuit board, comprising:
   a substantially planar circuit board having a first surface and a second surface on the opposite side of said first surface;
   a plurality of bus structures extending along a horizontal length of a portion of said circuit board, said bus structures comprising a plurality of through holes arranged successively at predetermined intervals along said horizontal length, with each successive through hole being offset in a vertical direction by a predetermined distance, wherein each successive pair of through holes in each bus structure, starting with a first through hole and a next, second through hole, is connected by a conductive lead formed on said first surface, and each successive pair of through holes in each bus structure, starting with said second through hole and a next, third through hole, is connected by another conductive lead formed on said second surface, whereby a twisted pair structure is defined by each bus structure;
   wherein a distance between said predetermined interval for at least one of said plurality of bus structures differs from that of one or more others of said plurality of bus structures.

2. The printed circuit board as set forth in claim 1 wherein said first surface is adapted to receive circuit components thereon.

* * * * *